US009607882B2

(12) United States Patent
Lin

(10) Patent No.: US 9,607,882 B2
(45) Date of Patent: Mar. 28, 2017

(54) SEMICONDUCTOR DEVICE AND MANUFACTURING METHOD THEREOF

(71) Applicant: TAIWAN SEMICONDUCTOR MANUFACTURING COMPANY, Hsinchu (TW)

(72) Inventor: Hsiang-Wei Lin, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/840,830

(22) Filed: Aug. 31, 2015

(65) Prior Publication Data
US 2017/0062265 A1    Mar. 2, 2017

(51) Int. Cl.
H01L 23/48      (2006.01)
H01L 23/52      (2006.01)
H01L 29/40      (2006.01)
H01L 21/764     (2006.01)
H01L 21/02      (2006.01)
H01L 21/768     (2006.01)
H01L 23/532     (2006.01)
H01L 23/528     (2006.01)
H01L 23/31      (2006.01)
H01L 29/06      (2006.01)

(52) U.S. Cl.
CPC ...... H01L 21/764 (2013.01); H01L 21/02123 (2013.01); H01L 21/02172 (2013.01); H01L 21/76807 (2013.01); H01L 21/76829 (2013.01); H01L 21/76877 (2013.01); H01L 23/3157 (2013.01); H01L 23/528 (2013.01); H01L 23/53295 (2013.01); H01L 29/0649 (2013.01)

(58) Field of Classification Search
None
See application file for complete search history.

(56) References Cited

U.S. PATENT DOCUMENTS

| 6,214,719 | B1 | 4/2001 | Nag |
| 2003/0168747 | A1 | 9/2003 | Hussein et al. |
| 2007/0281107 | A1* | 12/2007 | Kitagawa .......... H01J 37/32192 427/569 |
| 2008/0173976 | A1* | 7/2008 | Stamper ............. H01L 21/7682 257/531 |
| 2008/0265377 | A1 | 10/2008 | Clevenger et al. |

(Continued)

FOREIGN PATENT DOCUMENTS

TW    200908210 A    2/2009
TW    200941645 A    10/2009

OTHER PUBLICATIONS

Office Action Taiwanese Patent Application No. 10521032440 dated Aug. 22, 2016.

Primary Examiner — Calvin Choi
(74) Attorney, Agent, or Firm — McDermott Will & Emery LLP

(57) ABSTRACT

A semiconductor device includes metal wirings formed in a first interlayer dielectric layer disposed over a substrate, a first insulating layer covering portions of the metal wirings and the first interlayer dielectric layer, a second interlayer dielectric layer with air gaps disposed in a recess between adjacent two metal wirings, and a protective layer formed in a portion of an upper surface of the first interlayer dielectric layer, where the recess is not formed.

23 Claims, 5 Drawing Sheets

(56) References Cited

U.S. PATENT DOCUMENTS

2009/0166881 A1 7/2009 Balakrishnan et al.
2009/0191715 A1* 7/2009 Hayashi ............ H01L 21/31116
　　　　　　　　　　　　　　　　　　　　　　　438/710
2013/0049132 A1 2/2013 Doris et al.

* cited by examiner

SEMICONDUCTOR DEVICE AND MANUFACTURING METHOD THEREOF

TECHNICAL FIELD

The disclosure relates to a semiconductor integrated circuit, more particularly to a semiconductor device having air gaps between metal wirings and its manufacturing process.

BACKGROUND

As the semiconductor industry introduces new generations of integrated circuits (ICs) having higher performance and greater functionality, the density of the elements that form the ICs is increased, while the dimensions and spacing between components or elements of the ICs are reduced, which causes a variety of problems. For example, for any two adjacent conductive features, when the distance between the conductive features decreases, the resulting capacitance (parasitic capacitance) increases. The increased capacitance results in an increase of power consumption and an increase in the resistive-capacitive (RC) time constant, i.e., an increase of signal delays. The capacitance between two adjacent conductive features (e.g., metal wirings) is a function of the dielectric constant (k value) of an insulating material filled in the space between the conductive features (also, a function of a distance between the conductive features and a size of the side surfaces of the conductive features). Therefore, the continual improvement in semiconductor IC performance and functionality is dependent upon developing insulating (dielectric) materials with low k values. Since the substance with the lowest dielectric constant is air (k=1.0), air-gaps are formed to further reduce the effective k value of metal wiring layers.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-9 are cross sectional views illustrating exemplary sequential processes for manufacturing a semiconductor device having air gaps according to one embodiment of the present disclosure. FIGS. 1-9 illustrate exemplary sequential processes for fabricating one of metal wiring layers (wiring levels), which are formed above a substrate. Although there are core structures such as transistors or other elements (e.g., contacts etc.) constituting the semiconductor device (hereinafter referred to as "underlying structures") between the substrate and the metal wiring layers, detailed illustrations of such elements are omitted in FIGS. 1-9 for simplicity.

Figure 1:
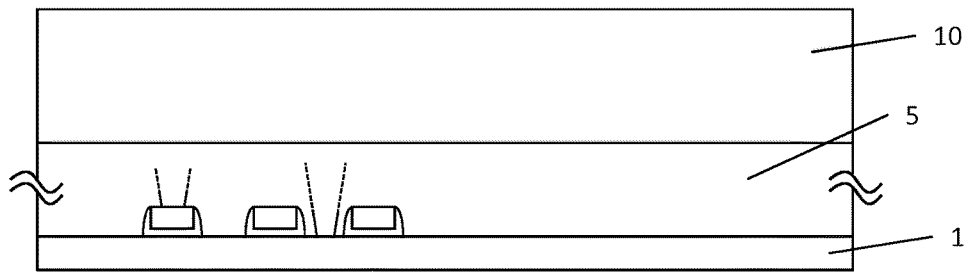
FIGS. 1-9 show exemplary sequential processes for manufacturing a semiconductor device having air gaps according to one embodiment of the present disclosure.

As shown in FIG. 1, a first interlayer dielectric (ILD) layer 10 is formed over the underlying structures 5 disposed over the substrate 1. An interlayer dielectric layer may also be called an inter-metal dielectric (IMD) layer. The first ILD layer 10 is made of, for example, one or more layers of low-k dielectric material. Low-k dielectric materials have a k-value (dielectric constant) lower than about 4.0. Some low-k dielectric materials have a k-value lower than about 3.5 and may have a k-value lower than about 2.5.

The materials for the first ILD layer 10 include elements of Si, O, C and/or H, such as SiCOH and SiOC. Organic material such as polymers may be used for the first ILD layer 10. For example, the first ILD layer 10 is made of one or more layers of a carbon-containing material, organo-silicate glass, a porogen-containing material, and/or combinations thereof. Nitrogen may also be included in the first ILD layer 10 in some embodiments. The first ILD layer 10 may be a porous layer. The density of the first ILD layer 10 is less than about 3 g/cm$^3$ in one embodiment and may be less than about 2.5 g/cm$^3$ in other embodiments. The first ILD layer 10 may be formed by using, for example, plasma-enhanced chemical vapor deposition (PECVD), low pressure CVD (LPCVD), atomic layer CVD (ALCVD), and/or a spin-on technology. In case of PECVD, the film is deposited at a substrate temperature in a range of about 25° C. to about 400° C. and at a pressure of less than 100 Torr.

In some embodiments, the first ILD layer may include a inter-layer insulating film and an inter-wire insulating film such that the metal wirings will be formed mainly in the inter-metal insulating film. The inter-layer insulating film may include a SiOC film and as the inter-wire insulating film may include a TEOS (tetraethylorthosilicate) film.

Figure 2:
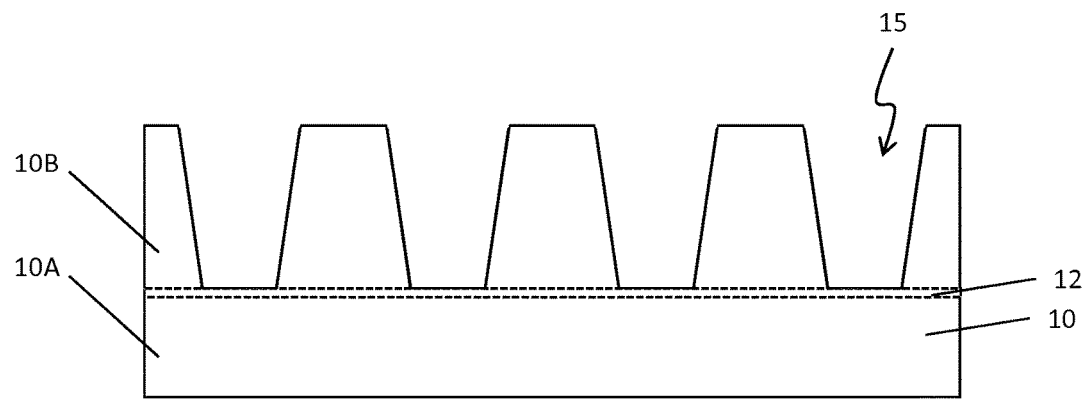

As shown in FIG. 2, first recesses 15 are formed in the first ILD layer 10 by using patterning operations including lithography and etching processes. In some embodiments, one or more via holes (contact holes) (not shown) to be connected to one or more elements of the underlying structures may be formed at the bottom of the first recesses.

In some embodiments, an etch-stop layer 12 may be used so that the bottoms of the recesses 15 can be defined. In such a case, the first ILD layer 10 may include a lower first ILD layer 10A and an upper first ILD layer 10B with the etch-stop layer 12 being interposed therebetween. The materials for the lower first ILD layer 10A and the upper first ILD layer 10B may be the same or different. If an etch-stop layer is not used, the depth of the recess may be controlled by controlling an etching time or an etching rate of the recess etching.

Figure 3:
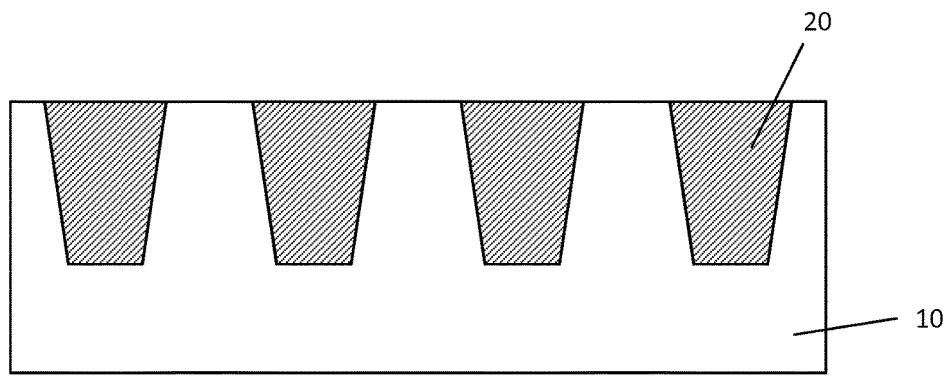

As shown in FIG. 3, a metal material is formed in the first recesses to form metal wirings 20. The operations to form the metal wirings include a damascene process. In the damascene process, one or more layers of metal material are formed in the first recesses 15 and the upper surface of the first ILD layer 10, and a planarization operation such as a chemical mechanical polishing method and/or a etch-back method is performed to remove portions of the metal material formed on the upper surface of the first ILD layer 10.

The one or more layers of metal material are formed by CVD, physical vapor deposition (PVD) and/or electroplating.

The metal material for the metal wirings 20 is one or more layers of Al, Cu, Co, Mn, W, Ti, Ta, TiN, TaN, TiW, WN, TiAl, TiAlN, TaC, TaCN and TiSiN. For example, the metal wirings 20 may include a barrier layer made of, for example, TiN and/or TaN, and a body layer made of, for example, Cu or Cu-based materials.

After forming the metal wirings 20, the upper surface of the first ILD layer 10 is modified to form a protective layer 30. The protective layer 30 has a higher nitrogen concentration than the first ILD layer 10, and may have a nitrogen concentration of about 50 atomic % or more in some embodiments and may have a nitrogen concentration of about 60 atomic % or more in other embodiments. The density of the protective layer 30 is higher than that of the first ILD layer 10. The density of the protective layer 30 is equal to or more than about 2.5 g/cm$^3$ in one embodiment and may be more than about 3.0 g/cm$^3$ in other embodiments. In certain embodiments, the density of the protective layer 30 may be equal to or more than about 3.5 g/cm$^3$.

In one embodiment of the present disclosure, a plasma treatment is performed to modify the upper surface of the first ILD layer 10. Ammonia (NH$_3$) and/or nitrogen (N$_2$) can be used as a source gas for the plasma treatment. The plasma treatment may include direct plasma or remote plasma at a temperature of about 100° C. to about 400° C. under a pressure of less than 100 Torr. Ion implantation may be employed to introduce nitrogen into the surface of the first ILD layer 10.

Figure 4:
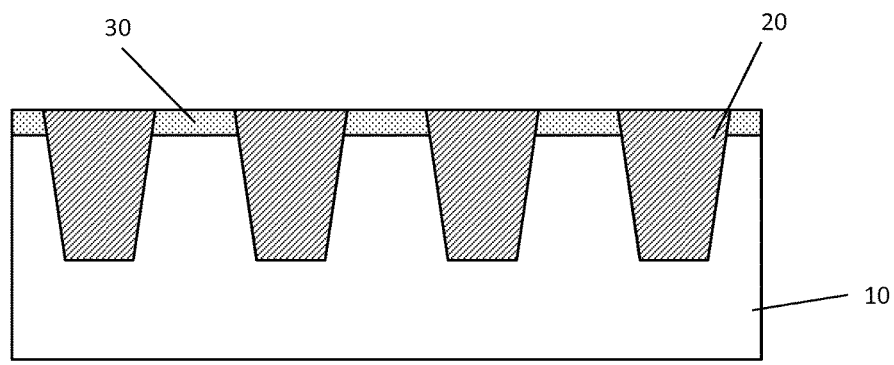
Figure 5:
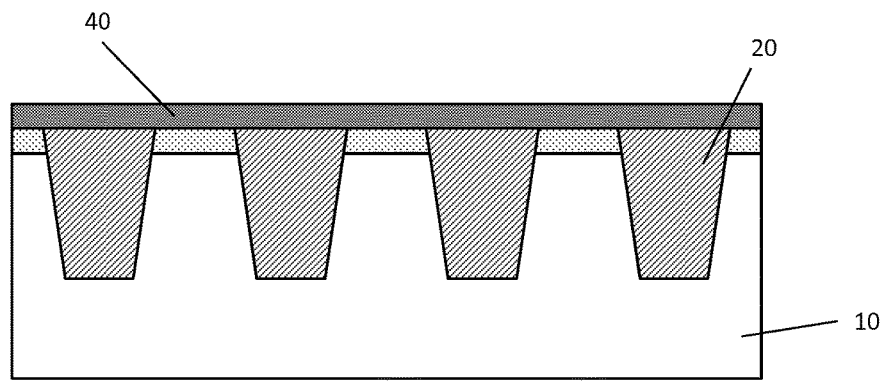

By the plasma treatment, a portion of the depth of about 0.5 nm to 20 nm of the upper surface of the first ILD layer 10 is modified into the protective layer 30. In some embodiments, the thickness of the protective layer may be about 1 nm to about 10 nm. As shown in FIG. 4, the protective layer 30 is formed at the upper surface of the first ILD layer 10 between the metal wirings 20.

After forming the protective layer 30, a first insulating layer 40 is formed over the metal wirings 20 and the protective layer 30. The first insulating layer 40 functions as a first etch-stop layer and a protection layer for the metal wirings 20.

The first insulating layer 40 includes one or more layers of a Si-based insulating material containing Si with O, N, C, B and or H, or an Al-based insulating material containing Al with O, N, C, B and or H. Examples of the first insulating layer include SiN, SiCO:H, SiCN:H, SiCON:H, AlOx, AlNx and AlNxOy. The dielectric constant of the first insulating layer may be in a range of about 4 to about 10.

The thickness of the first insulating layer 40 is in a range of about 1 nm to about 50 nm in some embodiments, and may be in a range of about 5 nm to about 30 nm in other embodiments. The density of the first insulating layer 40 is less than about 3 g/cm$^3$ in one embodiment and may be less than about 2.5 g/cm$^3$ in other embodiments.

The first insulating layer 40 may be formed by using, for example, PECVD, LPCVD, ALCVD, and/or a spin-on technology. In case of PECVD, the first insulating layer 40 is deposited at a substrate temperature in a range of about 25° C. to about 400° C. and at a pressure of less than 100 Torr.

Figure 6:
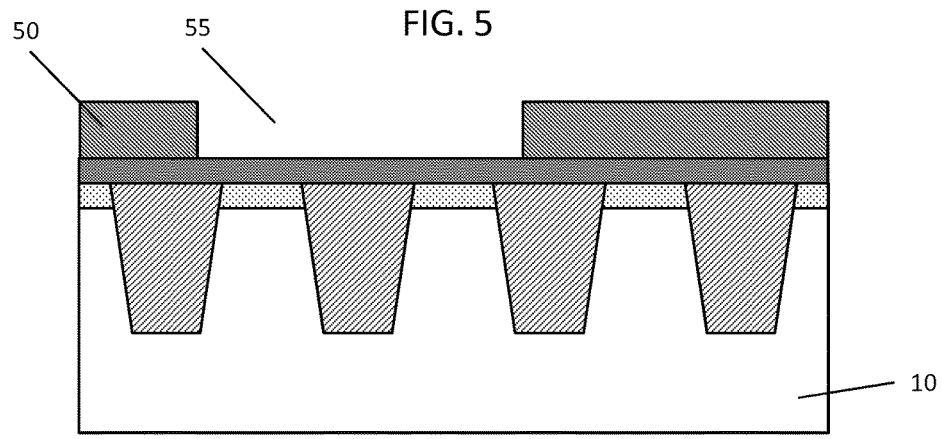
Figure 7:
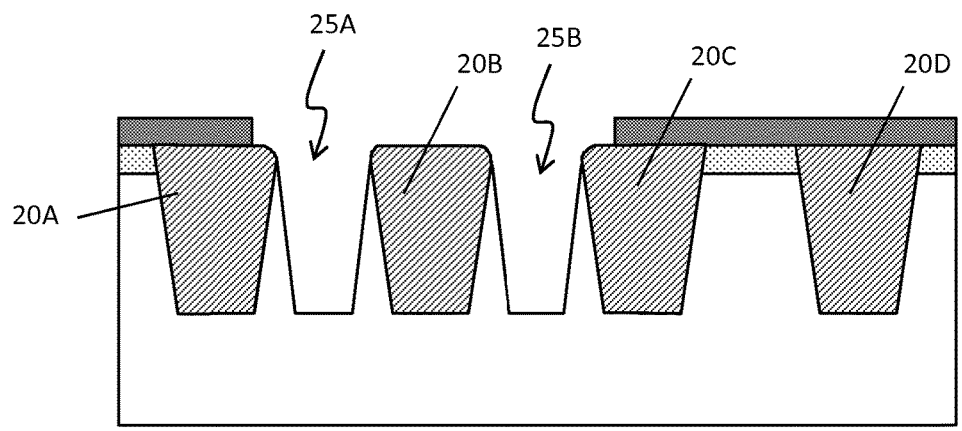

After the formation of the first insulating layer 40, second recesses 25A and 25B are formed in the first ILD layer 10 between the first wiring 20A and the second wiring 20B, and between the second wiring 20B and the third wiring 20C, as shown in FIGS. 6 and 7. In this embodiment, no second recess is formed between the third wiring 20C and the fourth wiring 20D, but this is merely one example and the second recesses can be formed in any space between two wirings depending on applications and designs, or only one recess between the adjacent wirings may be formed in other embodiments.

The second recesses 25A and 25B are formed in the first ILD layer 10 by using patterning operations including lithography and etching processes. As shown in FIG. 6, a mask layer 50, for example, a resist mask, is formed on the first insulating layer 40, and an opening 55 is formed by a lithography process. Then, by using dry etching and/or wet etching, the first insulating layer 40 and the first ILD layer 10 in the opening 55 are etched to form the second recesses 25A and 25B, as shown in FIG. 7. Since this etching mainly etches the insulating materials of the first insulating layer 40 and the first ILD layer 10 and the metal material for the wiring layers is not substantially etched, the second recesses 25A and 25B are formed self-aligned beside the second wiring 20B. The depth of the second recesses 25A and 25B may be at the same level as the bottoms of the metal wiring 20 or may be deeper than the bottoms of the metal wirings 20.

The dry etching to form the second recesses 25A and 25B utilizes gases containing fluorine F and/or chlorine (Cl). The radicals of F and Cl may penetrate into the interface between the metal wirings 20 and the first insulating layer 40. If, as shown in FIG. 13B, the protective layer 30 is not formed in the upper surface of the first ILD layer 10, the radicals of F and Cl may further penetrate and diffuse into the first ILD layer 10 (see the arrows in FIG. 13B). The diffused F and Cl may induce a current leakage and lower the reliability of the semiconductor device.

Figure 13A:
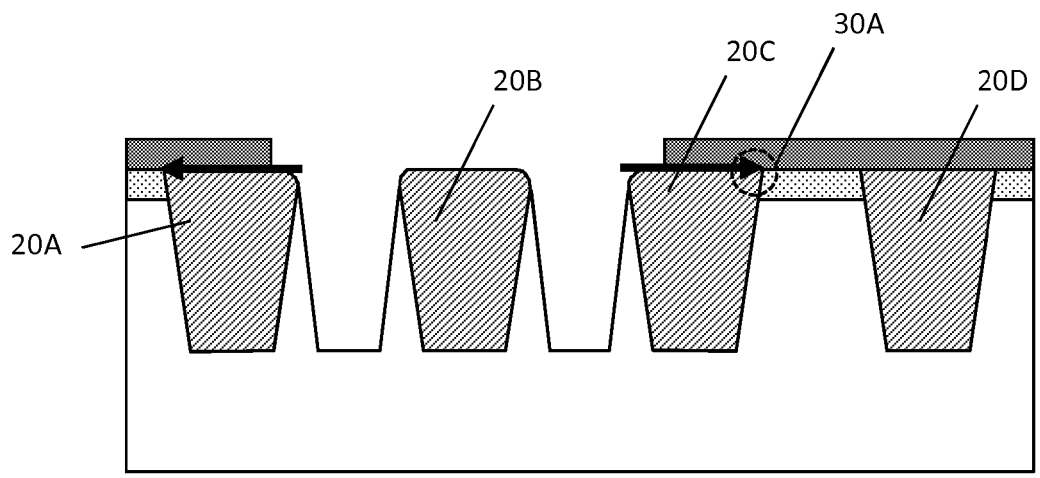
FIGS. 13A and 13B show radical diffusion into an interlayer dielectric layer.
Figure 13B:
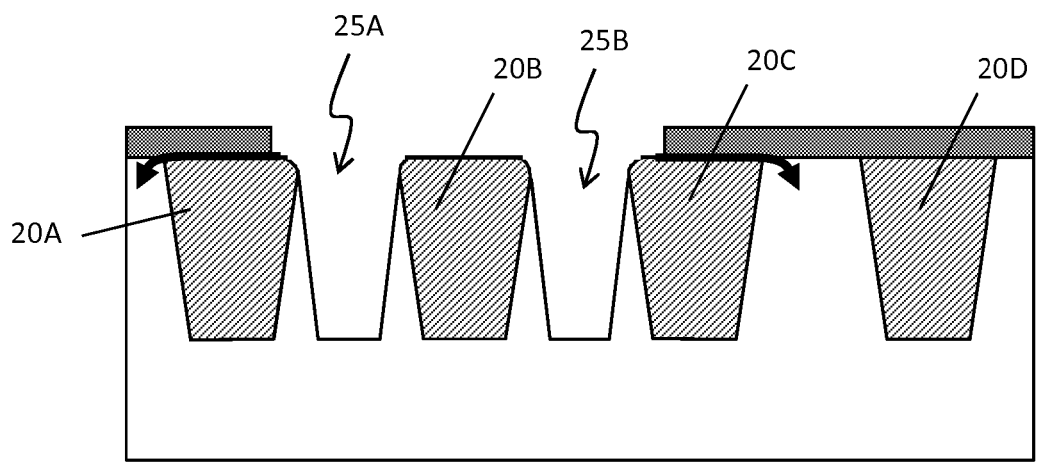

In contrast, in the present embodiment, since the protective layer 30 is formed in the upper surface of the first ILD layer 10, the radicals of F and Cl are stopped at the protective layer 30 (see the arrows in FIG. 13A), are accumulated up and do not penetrate or diffuse into the first ILD layer 10, as shown in FIG. 13A. At the point 30A of FIG. 13A, it is possible to observe an accumulation of F and/or Cl. At least one of F and Cl is at a higher concentration at a portion of an interface among the first insulating layer 40, one of the metal wirings 20 and the protective layer 30 than in the first insulating layer. The concentration of F and/or Cl may be 5 to 10 times the concentration of F and/or Cl in the first ILD layer 10.

Figure 8:
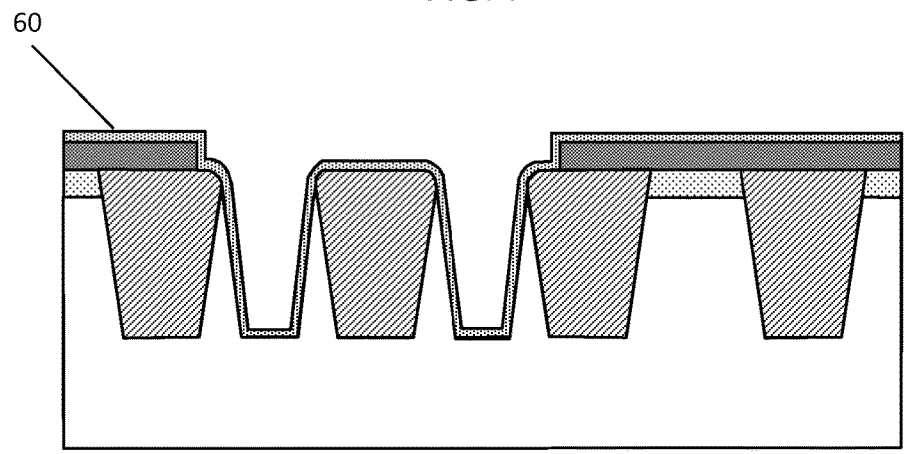

After forming the second recesses 25A and 25B, a second insulating layer 60 is formed on the remaining first insulating layer 40, exposed metal wirings and in the second recesses 25A and 25B, as shown in FIG. 8. The second insulating layer 60 functions as a second etch-stop layer and a protection layer for the metal wirings 20.

The second insulating layer 60 includes one or more layers of a Si-based insulating material containing Si with O, N, C, B and or H, or an Al-based insulating material containing Al with O, N, C, B and or H. Examples of the second insulating layer include SiN, SiCO:H, SiCN:H, SiCON:H, AlOx, AlNx and AlNxOy. The dielectric constant of the second insulating layer may be in a range of about 4 to about 10.

The thickness of the second insulating layer 60 is smaller than that of the first insulating layer and is in a range of about 0.5 nm to about 30 nm in some embodiments, and may be in a range of about 1 nm to about 10 nm in other embodiments. The density of the second insulating layer 60 is less than about 3 g/cm$^3$ in one embodiment and may be less than about 2.5 g/cm$^3$ in other embodiments. The second insulating layer 60 may be formed by using, for example, PECVD, LPCVD and ALCVD.

Figure 9:
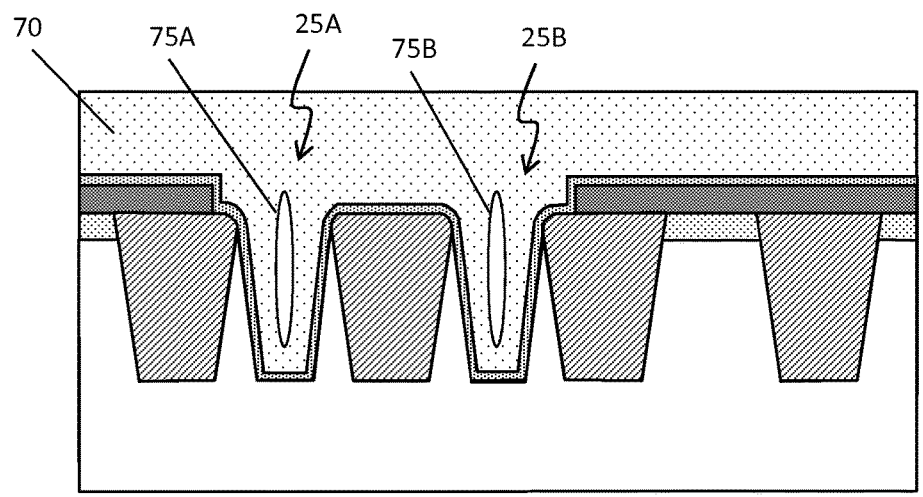

Further, as shown in FIG. 9, a second ILD layer 70 is formed over the second insulating layer 60. Air gaps 75A and 75B are formed in the second recesses 25A and 25B, as shown in FIG. 9.

To form air gaps, non-conformal CVD method with a low step coverage condition may be utilized. By using non-conformal CVD, the upper portions of the second ILD layer "pinch-off" (are connected) before the second recesses are fully filled with the insulating material of the second ILD layer, thereby forming air gaps in the second recesses.

The second ILD layer 70 may include one or more layers of silicon oxide, silicon oxynitride (SiON), SiCN, SiOC or SiOCN. The second ILD layer 70 may be doped with, for example, phosphorous, to enhance its void formation effects.

In the above embodiment, the first ILD layer and the metal wirings are formed just above the underlying core structures. However, the first ILD layer and the metal wiring layers may be formed in one or more upper layers.

Figure 10:
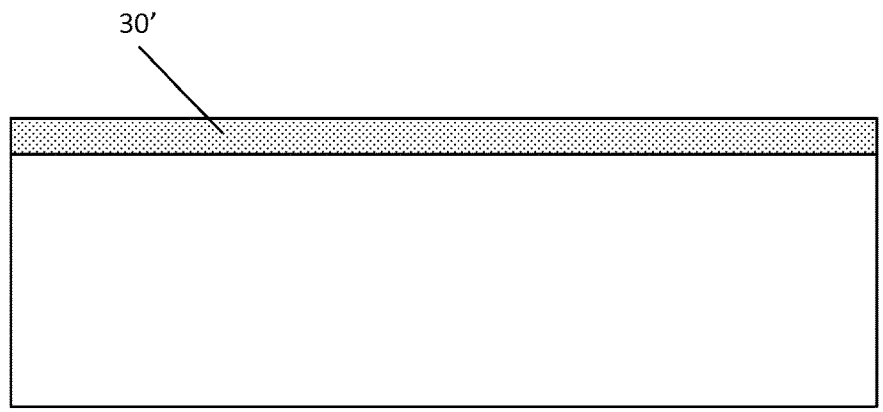
FIGS. 10-12 show exemplary sequential processes for manufacturing a semiconductor device having air gaps according to another embodiment of the present disclosure.
Figure 11:
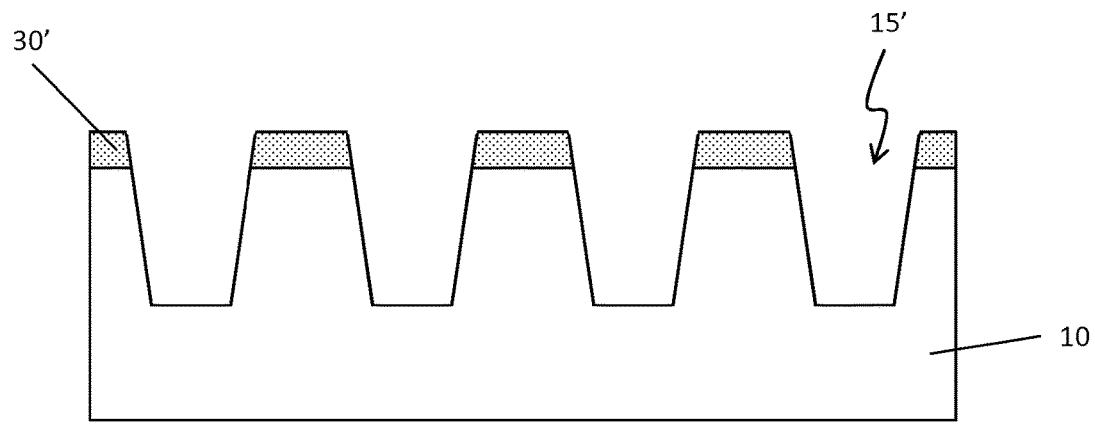
Figure 12:
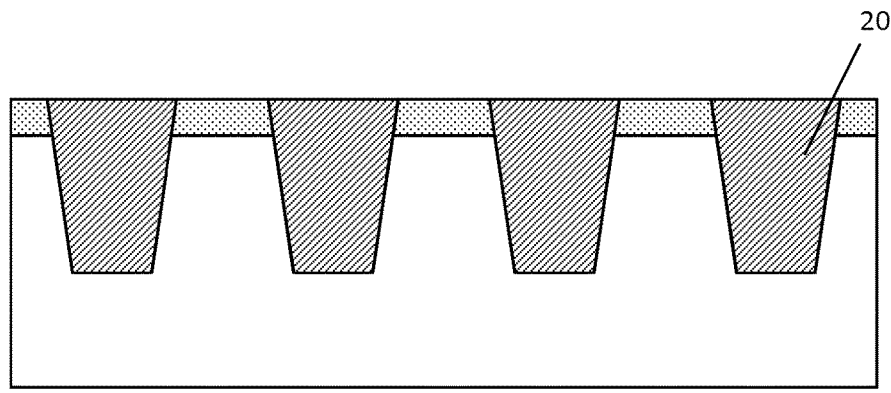

FIGS. 10-12 show exemplary sequential processes for manufacturing a semiconductor device having air gaps according to another embodiment of the present disclosure. It is understood that additional operations can be provided before, during, and after processes shown by FIGS. 10-12, and some of the operations described below can be replaced or eliminated, in additional embodiments of the method. The order of the operations/processes may be interchangeable. Further, the operation, process, configuration or materials that are same as or similar to those of the aforementioned embodiment may be applied to this embodiments and the detailed explanation thereof may be omitted.

Similar to FIG. 1, a first interlayer dielectric (ILD) layer 10 is formed over the underlying structures disposed over the substrate. Then, as shown in FIG. 10, a protective layer 30' is formed over the upper surface of the first ILD layer 10.

The protective layer 30' includes one or more layer of SiN, SiON, SiCN or SiCON with or without an additional element such as B or H. When hydrogen (H) exists, the content of H is less than the content of boron (B). The protective layer 30' has a higher nitrogen concentration than the first ILD layer 10, and may have a nitrogen concentration of about 50 atomic % or more in some embodiments and may have a nitrogen concentration of about 60 atomic % or more in other embodiments. The density of the protective layer 30' is higher than that of the first ILD layer 10. The density of the protective layer 30' is equal to or more than about 2.5 g/cm$^3$ in one embodiment and may be more than about 3.0 g/cm$^3$ in other embodiments. In certain embodiments, the density of the protective layer 30' may be equal to or more than about 3.5 g/cm$^3$.

The protective layer 30' may be formed by using, for example, PECVD, LPCVD and/or ALCVD. The protective layer 30' may be formed by the plasma treatment as set forth above with respect to FIGS. 3 and 4.

The thickness of the protective layer 30' is in a range of about 0.5 nm to about 20 nm in some embodiments, or may be in a range of about 1 nm to about 10 nm in other embodiments.

As shown in FIG. 11, first recesses 15' are formed in the first ILD layer 10 and the protective layer 30' by using patterning operations including lithography and etching processes.

Similar to FIG. 3, a metal material is formed in the first recesses to form metal wirings 20 as shown in FIG. 12. Similar to FIG. 3, the operations to form the metal wirings include a damascene process. By this operation, the structure similar to FIG. 4 can be obtained. After the structure shown in FIG. 12 is obtained, the same or similar operations with respect to FIGS. 5-9 are performed to obtain the semiconductor device having air gaps.

The various embodiments or examples described herein offer several advantages over the existing art. For example, in the present disclosure, since the protective layer is formed in a portion of the upper surface of the first interlayer dielectric layer, at which the recess is not formed, radical diffusion into the interlayer dielectric layer covered by the first insulating layer can be suppressed, thereby preventing current leakage and improving device reliability. In addition, it is possible to increase a process window for making an air gap, and to improve reliability of the device.

It will be understood that not all advantages have been necessarily discussed herein, no particular advantage is required for all embodiments or examples, and other embodiments or examples may offer different advantages.

In accordance with one aspect of the present disclosure, a method for manufacturing a semiconductor device includes forming a first interlayer dielectric layer over a substrate. First recesses are formed in the first interlayer dielectric layer. Metal wirings are formed in the first recesses. A protective layer is formed in a surface of the first interlayer dielectric layer between the metal wirings. Second recesses are formed in the first interlayer dielectric layer between the metal wirings. A second interlayer dielectric layer is formed so that air gaps are formed in the second recesses.

In accordance with another aspect of the present disclosure, a method for manufacturing a semiconductor device includes forming a first interlayer dielectric layer over a substrate. A protective layer is formed on the first interlayer dielectric layer. First recesses are formed by etching the first interlayer dielectric layer and the protective layer. Metal wirings are formed in the first recesses. A first insulating layer is formed over the wirings and the protective layer. Second recesses are formed by etching the first insulating layer, the protective layer and the first interlayer dielectric layer between adjacent metal wirings. A second insulating layer is formed at least in the second recesses. A second interlayer dielectric layer is formed so that air gaps are formed in the second recesses.

In accordance with another aspect of the present disclosure, a semiconductor device includes metal wirings formed in a first interlayer dielectric layer disposed over a substrate, a first insulating layer covering portions of the metal wirings and the first interlayer dielectric layer. A second interlayer dielectric layer with air gaps is disposed in a recess between adjacent two metal wirings, and a protective layer is formed in a portion of an upper surface of the first interlayer dielectric layer, where the recess is not formed.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a first interlayer dielectric layer over a substrate;
   forming first recesses in the first interlayer dielectric layer;
   forming metal wirings in the first recesses;
   forming a protective layer in a surface of the first interlayer dielectric layer between the metal wirings but not on upper surfaces of the metal wirings;
   forming a first insulating layer on the upper surfaces of the metal wirings and the protective layer;
   forming second recesses in the first interlayer dielectric layer between the metal wirings by partially etching the first insulating layer, the protective layer and the first interlayer dielectric layer; and
   forming a second interlayer dielectric layer so that air gaps are formed in the second recesses.

2. The method of claim 1, wherein the forming a protective layer comprises modifying the surface of the first interlayer dielectric layer to have a higher density than the first interlayer dielectric layer.

3. The method of claim 2, wherein a density of the protective layer is equal to or more than 2.5 g/cm$^3$.

4. The method of claim 1, wherein the forming a protective layer comprises introducing nitrogen into the surface of the first interlayer dielectric layer.

5. The method of claim 4, wherein the nitrogen is introduced into the surface of the first interlayer dielectric layer by using plasma with nitrogen containing gas.

6. The method of claim 4, wherein a nitrogen concentration in the protective layer is 50 atomic % or more.

7. The method of claim 1, wherein the first insulating layer includes one or more layers of a Si-based insulating material or an Al-based insulating material.

8. The method of claim 1, wherein the forming second recesses is performed with at least portion of the upper surface of the first interlayer dielectric layer between adjacent two metal wiring being covered by the first insulating layer.

9. The method of claim 1, further comprising, after forming the second recesses and before forming the second interlayer dielectric layer, forming a second insulating layer at least in the second recesses.

10. The method of claim 9, wherein the second insulating layer includes one or more layers of a Si-based insulating material or an Al-based insulating material.

11. The method of claim 1, wherein the forming the first recesses comprises dry-etching the first interlayer dielectric layer using a gas containing at least one of F and Cl.

12. The method of claim 1, wherein a thickness of the protective layer is in a range of 0.5 nm to 20 nm.

13. A method for manufacturing a semiconductor device, comprising:
   forming a first interlayer dielectric layer over a substrate;
   forming a protective layer on the first interlayer dielectric layer;
   forming first recesses by etching the first interlayer dielectric layer and the protective layer;
   forming metal wirings in the first recesses;
   forming a first insulating layer over the wirings and the protective layer;
   forming second recesses by etching the first insulating layer, the protective layer and the first interlayer dielectric layer between adjacent metal wirings;
   forming a second insulating layer at least in the second recesses; and
   forming a second interlayer dielectric layer so that air gaps are formed in the second recesses.

14. The method of claim 13, wherein the protective layer includes one or more layers of SiN, SiON, SiCN and SiOCN.

15. A semiconductor device, comprising:
   metal wirings formed in a first interlayer dielectric layer disposed over a substrate;
   a first insulating layer covering portions of the metal wirings and the first interlayer dielectric layer;
   a second interlayer dielectric layer with air gaps disposed in a recess between adjacent two metal wirings;
   a first protective layer formed in a portion of an upper surface of the first interlayer dielectric layer, where the recess is not formed; and
   a second protective layer partially covering upper surfaces of the metal wirings and the first protective layer
   wherein the first protective layer is not formed on upper surfaces of the metal wirings.

16. The semiconductor device of claim 15, wherein the protective layer has a higher density than the first interlayer dielectric layer.

17. The semiconductor device of claim 16, wherein a density of the protective layer is equal to or more than 2.5 g/cm$^3$.

18. The semiconductor device of claim 15, wherein a nitrogen concentration in the protective layer is 50 atomic % or more.

19. The semiconductor device of claim 15, further comprising a second insulating layer formed in the recess between adjacent two metal wirings.

20. The method of claim 1, wherein the first insulating layer includes an Al-based insulating material.

21. The method of claim 1, wherein the forming the first recesses comprises dry-etching the first interlayer dielectric layer using a gas containing Cl.

22. The method of claim 2, wherein a density of the protective layer is equal to or more than 3.0 g/cm$^3$.

23. The method of claim 4, wherein a nitrogen concentration in the protective layer is 60 atomic % or more.

* * * * *